US012721050B2

(12) United States Patent
Xu et al.

(10) Patent No.: US 12,721,050 B2
(45) Date of Patent: Aug. 25, 2026

(54) METHOD FOR PREPARING RESERVOIR ELEMENT

(71) Applicant: INSTITUTE OF MICROELECTRONICS, CHINESE ACADEMY OF SCIENCES, Beijing (CN)

(72) Inventors: Xiaoxin Xu, Beijing (CN); Wenxuan Sun, Beijing (CN); Jie Yu, Beijing (CN); Jinru Lai, Beijing (CN); Xu Zheng, Beijing (CN); Danian Dong, Beijing (CN)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 379 days.

(21) Appl. No.: 18/559,755

(22) PCT Filed: Mar. 15, 2022

(86) PCT No.: PCT/CN2022/080856
§ 371 (c)(1),
(2) Date: Nov. 8, 2023

(87) PCT Pub. No.: WO2023/115723
PCT Pub. Date: Jun. 29, 2023

(65) Prior Publication Data

US 2024/0260488 A1 Aug. 1, 2024

(30) Foreign Application Priority Data

Dec. 23, 2021 (CN) ......................... 202111593480.3

(51) Int. Cl.
*H10N 70/00* (2023.01)
*H10N 70/20* (2023.01)

(52) U.S. Cl.
CPC ......... *H10N 70/041* (2023.02); *H10N 70/023* (2023.02); *H10N 70/026* (2023.02); *H10N 70/25* (2023.02); *H10N 70/8836* (2023.02)

(58) Field of Classification Search
CPC .. H10N 70/041; H10N 70/023; H10N 70/026; H10N 70/25; H10N 70/8836
See application file for complete search history.

(56) References Cited

U.S. PATENT DOCUMENTS

2014/0264231 A1* 9/2014 Wang .................. H10N 70/826 257/4
2015/0333257 A1* 11/2015 Ramaswamy ....... H10N 70/041 257/4

(Continued)

FOREIGN PATENT DOCUMENTS

| | | |
|---|---|---|
| CN | 110676375 A | 1/2020 |
| CN | 111312898 A | 6/2020 |
| CN | 112488308 A | 3/2021 |

OTHER PUBLICATIONS

Translation of CN 111312898 A, which the original document is cited on the applicant's IDS filed Jul. 11, 2025, and already included in file folder.*

(Continued)

*Primary Examiner* — Eugene Lee
(74) *Attorney, Agent, or Firm* — Goodwin Procter LLP

(57) ABSTRACT

A method for manufacturing a reservoir computing apparatus, related to artificial intelligence. The method comprises: step a), providing a bottom electrode layer, a dielectric layer, a resistive switching layer, and a top electrode layer based on the above-listed sequence on a substrate to obtain a to-be-annealed reservoir computing apparatus; and step b), annealing the to-be-annealed reservoir computing apparatus to obtain the reservoir computing apparatus, where a temperature of the annealing ranges from 300° C. to 700° C., and (Continued)

duration of the annealing duration ranges from 30s to 100s. The manufactured reservoir computing apparatus is subject to rapid annealing, which redistributes defects, forms a more stable film, and introduces a ferroelectric O-phase into the film. The rapid annealing reduces power consumption and improves computing accuracy effectively.

9 Claims, 7 Drawing Sheets

(56) References Cited

U.S. PATENT DOCUMENTS

2016/0197271 A1 7/2016 Gassilloud et al.
2020/0152867 A1* 5/2020 Chiang ................ G11C 13/003
2020/0303417 A1* 9/2020 Teo .................... H10D 30/6758
2021/0336135 A1* 10/2021 Jiang .................... H10N 70/023
2021/0408019 A1* 12/2021 Makala ................ H10N 70/231
2025/0098553 A1* 3/2025 Islam ..................... H10N 70/20

OTHER PUBLICATIONS

International Search Report and Written Opinion for PCT/CN2022/080856, 13 pages.

* cited by examiner

METHOD FOR PREPARING RESERVOIR ELEMENT

This application is the national phase of International Application No. PCT/CN2022/080856, titled “METHOD FOR PREPARING RESERVOIR ELEMENT”, filed on Mar. 15, 2022, which claims priority “METHOD FOR to Chinese Patent Application No. 202111593480.3, titled MANUFACTURING RESERVOIR COMPUTING APPARATUS”, filed on Dec. 23, 2021 with the China National Intellectual Property Administration, which is hereby incorporated by reference in its entirety.

FIELD

The present disclosure relates to the technical field of artificial intelligence, and in particular to a method for manufacturing reservoir computing apparatus.

BACKGROUND

The artificial intelligence has a history traced back to the 1940s, and has developed rapidly in the past ten years in the fields of image recognition, speech recognition, finance, medicine, games, etc. The neural networks can be categorized into feedforward neural network and recurrent neural network (RNN) based on their structures. The feedforward neural network is for processing static image signals. The RNN is suitable for processing time-dependent signals due to its internal loop connection, and is likely subject to vanishing or exploding gradients during its training due to a complex structure. Hence, it is difficult to implement the RNN in hardware, which leads to a concept of reservoir computing (RC).

The reservoir computing stems from the echo state network proposed by H. Jaeger et al. in 2001 and the liquid state machine proposed by W. Maass et al. in 2002. Many researches have been conducted since then on hardware implementation of a reservoir. For example, analog circuits, optical systems, spin-torque nano-oscillators (STO) systems, and the like are utilized to build delayed feedback systems to realize the reservoir. The reservoir in these solutions occupies a large area, has low system energy efficiency, and is difficult to be integrated. In 2012, the concept of a memristor-based reservoir was proposed by Manjari S. Kulkarni et al. The memristor is very suitable for hardware implementation of RC systems due to its inherent nonlinearity and volatility.

In the RC systems, power consumption is a crucial parameter, and a result of fitting a dynamic characteristic curve of a component also has a direct influence on accuracy of the RC system. A key research topic in the field is how to reduce the power consumption of reservoir computing apparatuses and improve their computing accuracy effectively.

SUMMARY

In view of the above, an objective of the present disclosure is providing a method for manufacturing a reservoir computing apparatus. The reservoir computing apparatus manufactured according to the method has low power consumption and high computing accuracy.

A method for manufacturing a reservoir computing apparatus is provided according to embodiments the present disclosure, comprising: step a), providing a bottom electrode layer, a dielectric layer, a resistive switching layer, and a top electrode layer based on the above-listed sequence on a substrate to obtain a to-be-annealed reservoir computing apparatus; and step b), annealing the to-be-annealed reservoir computing apparatus to obtain the reservoir computing apparatus, where a temperature of the annealing ranges from 300° C. to 700° C., and duration of the annealing duration ranges from 30 s to 100 s.

In an embodiment, in the step a), the bottom electrode layer is provided through one or more of: sputtering, physical vapor deposition, and chemical vapor deposition.

In an embodiment, in the step a), the bottom electrode layer is made of one or more of: TiN, polycrystalline silicon, W, and Pt, and a thickness of the bottom electrode layer ranges from 15 nm to 300 nm.

In an embodiment, in the step a), the dielectric layer is provided through one or both of sputtering and oxygen plasma surface treatment.

In an embodiment, in the step a), the dielectric layer is made of one or more of: $TiO_x$, $AlO_y$, and $TaO_z$, where $1.2 \le x \le 2.5$, $1.2 \le y \le 2.5$, and $1.2 \le z \le 2.5$.

In an embodiment, in the step a), the resistive switching layer is provided through one or more of: atomic layer deposition, magnetron sputtering, and ion beam sputtering.

In an embodiment, in the step a), the resistive switching layer is made of $Hf_nZr_{1-n}O_2$, where $0<n<1$, and a thickness of the resistive switching layer ranges from 2.5 nm to 6 nm.

In an embodiment, in the step a), the top electrode layer is provided through sputtering.

In an embodiment, in the step a), the top electrode layer is made of one or more of: Ru, TiN, W and Pt, and a thickness of the top electrode layer ranges from 20 nm to 60 nm.

In an embodiment, in the step b), the temperature of the annealing is 500° C., and the duration of the annealing is 60 s.

Compared with the conventional technology, the method for manufacturing the reservoir computing apparatus according to embodiments of the present disclosure comprises: step a), providing the bottom electrode layer, the dielectric layer, the resistive switching layer, and the top electrode layer based on the above-listed sequence on the substrate to obtain the to-be-annealed reservoir computing apparatus; and step b), annealing the to-be-annealed reservoir computing apparatus to obtain the reservoir computing apparatus, where the temperature of the annealing ranges from 300° C. to 700° C., and the duration of the annealing duration ranges from 30 s to 100 s. Herein the manufactured reservoir computing apparatus is subject to rapid annealing. Since defects are redistributed after the rapid annealing, a more stable film is formed, and the ferroelectric O-phase can be introduced into the film. When a positive voltage is applied to the annealed reservoir computing apparatus, the defects in the film moves under an electric field to generate high conductivity locally, i.e., induce the resistive switching effect. The ferroelectric domains switch at the same time, which enhances a change in conductance of the apparatus. As a result, double field effects can reduce a programming voltage required by the apparatus. When the positive voltage is removed, most of the ferroelectric domains in the apparatus revert to the initial state automatically, and the remaining ferroelectric domains revert to the initial state under a small negative voltage. A cycle-to-cycle variation of the apparatus is small, and hence the noise introduced into the RC system is negligible. States of a memory layer is enriched, and a computing capability and accuracy of the RC system are effectively improved.

BRIEF DESCRIPTION OF THE DRAWINGS

For clearer illustration of the technical solutions according to embodiments of the present disclosure or conventional techniques, hereinafter briefly described are the drawings to be applied in embodiments of the present disclosure or conventional techniques. Apparently, the drawings in the following descriptions are only some embodiments of the present disclosure and other drawings may be obtained by those ordinary skilled in the art based on the provided drawings without creative efforts.

DETAILED DESCRIPTION OF EMBODIMENTS

Figure 1:
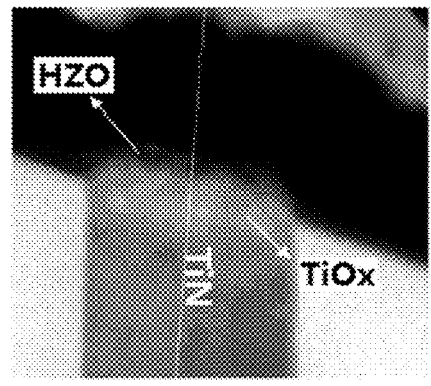
FIG. 1 is a transmission electron microscopy (TEM) image of a reservoir computing apparatus according to an embodiment of the present disclosure.

Hereinafter the technical solutions in the embodiments of the present disclosure are illustrated clearly and thoroughly. Apparently, the described embodiments are only some rather than all of the embodiments of the present disclosure. Any other embodiments obtained based on the embodiments of the present disclosure by those ordinary skilled in the art without any creative effort fall within the scope of protection of the present disclosure.

A method for manufacturing a reservoir computing apparatus is provided according to an embodiment of the present disclosure. The method comprises step a) and step b) as follows.

In step a), a bottom electrode layer, a dielectric layer, a resistive switching layer, and a top electrode layer are provided based on the above-listed sequence on a substrate to obtain a to-be-annealed reservoir computing apparatus.

In step b), the to-be-annealed reservoir computing apparatus is annealed to obtain the reservoir computing apparatus.

Herein in the step a), the substrate may be a silicon wafer. The bottom electrode layer may be made of one or more of TiN, polycrystalline silicon, W, and Pt, and a thickness of the bottom electrode layer may range from 15 nm to 300 nm. For example, the thickness may be 15 nm, 20 nm, 30 nm, 40 nm, 50 nm, 60 nm, 70 nm, 80 nm, 90 nm, 100 nm, 120 nm, 150 nm, 170 nm, 200 nm, 230 nm, 250 nm, 270 nm, or 300 nm. A manner of providing the bottom electrode layer may be one or more of sputtering, physical vapor deposition, and chemical vapor deposition.

Herein in the step a), the dielectric layer may be made of one or more of $TiO_x$, $AlO_y$ and $TaO_z$. x, y and z each ranges from 1.2 to 2.5, and each may be independently evaluated as 1.2, 1.3, 1.4, 1.5, 1.6, 1.7, 1.8, 1.9, 2, 2.1, 2.2, 2.3, 2.4, or 2.5. A manner of providing the dielectric layer may be sputtering and/or oxygen plasma surface treatment. A temperature of the oxygen plasma surface treatment may range from 200 to 500° C. For example, the temperature may be 200° C., 250° C., 300° C., 350° C., 400° C., 450° C., or 500° C. The oxygen plasma surface treatment may be performed under power of 80 W to 200 W. For example, the power may be 80 W, 90 W, 100 W, 110 W, 120 W, 130 W, 140 W, 150 W, 160 W, 170 W, 180 W, 190 W, or 200 W. Duration of the oxygen plasma surface treatment may range from 10 min to 30 min. For example, the duration may be 10 min, 12 min, 15 min, 17 min, 20 min, 23 min, 25 min, 27 min, or 30 min. Herein concentration of oxygen in the dielectric layer is adjusted through altering a condition parameter of performing the sputtering and/or the oxygen plasma surface treatment, so as to adjust a barrier height between the dielectric layer and the resistive switching layer into a desirable range.

Herein in the step a), the resistive switching layer may be made of $Hf_nZr_{1-n}O_2$ (Hafnium-Zirconium Oxide, HZO), where $0<n<1$. n may range from 0.3 to 0.7. For example, n may be equal to 0.3, 0.4, 0.5, 0.6, or 0.7. A thickness of the resistive switching layer may range from 2.5 nm to 6 nm. For example, the thickness may be 2.5 nm, 3 nm, 3.5 nm, 4 nm, 4.5 nm, 5 nm, 5.5 nm, or 6 nm. A manner of providing the resistive variable layer may be one or more of atomic layer deposition, magnetron sputtering, and ion beam sputtering. A temperature for providing the resistive switching layer may range from 200 to 300° C. For example, the temperature may be 200° C., 210° C., 220° C., 230° C., 240° C., 250° C., 260° C., 270° C., 280° C., 290° C., or 300° C. Herein a surface barrier may be altered by controlling a thickness of the resistive switching layer and concentrations of Hf and Zr, so as to adjust an operation current of the reservoir computing apparatus.

Herein in the step a), the top electrode layer may be made of one or more of Ru, TiN, W, and Pt. A thickness of the top electrode layer may range from 20 nm to 60 nm. For example, the thickness may be 20 nm, 25 nm, 30 nm, 35 nm, 40 nm, 45 nm, 50 nm, 55 nm, or 60 nm. A manner of providing the top electrode layer may be sputtering.

Herein in the step b), a temperature of the annealing may range from 300° C. to 700° C. For example, the temperature may be 300° C., 320° C., 350° C., 370° C., 400° C., 420° C., 450° C., 470° C., 500° C., 520° C., 550° C., 570° C., 600° C., 620° C., 650° C., 670° C., or 700° C. A preferable temperature of the annealing is 500° C. Duration of the annealing duration may range from 30 s to 100 s. For example, the duration may be 30 s, 35 s, 40 s, 45 s, 50 s, 55 s, 60 s, 65 s, 70 s, 75 s, 80 s, 85 s, 90 s, 95 s, or 100 s. A preferable duration of the annealing is 60 s.

Herein in the step b), the annealing is performed at a specific temperature and with specific duration. Thereby, defects in the resistive switching layer can be redistributed to form a more stable film, which improves uniformity of performances across the whole apparatus. Moreover, O-phase can be generated in the resistive switching layer, so that the apparatus has ferroelectricity and an enhanced polarization. During operation of the annealed apparatus, the resistive switching and the polarization couple under an electric field, and hence a programming voltage of the apparatus and a power consumption of the whole device can be significantly reduced.

In embodiments of the present disclosure, the manufactured reservoir computing apparatus is subject to rapid annealing. Since defects are redistributed after the rapid annealing, a more stable film is formed, and the ferroelectric O-phase can be introduced into the film. When a positive voltage is applied to the annealed reservoir computing apparatus, the defects in the film moves under an electric field to generate high conductivity locally, i.e., induce the resistive switching effect. The ferroelectric domains switch at the same time, which enhances a change in conductance of the apparatus. As a result, double field effects can reduce a programming voltage required by the apparatus. When the positive voltage is removed, most of the ferroelectric domains in the apparatus revert to the initial state automatically, and the remaining ferroelectric domains revert to the initial state under a small negative voltage. A cycle-to-cycle variation of the apparatus is small, and hence the noise introduced into the RC system is negligible. States of a memory layer is enriched, and a computing capability and accuracy of the RC system are effectively improved.

Hereinafter detailed description is provided through embodiments for clarity.

First Embodiment

A method for manufacturing a reservoir computing apparatus comprises following steps 1) to 5).

In step 1), a bottom electrode layer made of TiN is deposited on a silicon wafer through magnetron sputtering, where a thickness of the bottom electrode layer is 30 nm.

In step 2), a dielectric layer made of TiOx is grown on the bottom electrode layer through oxygen plasma surface treatment. A concentration of oxygen in the dielectric layer is adjusted through configuring a condition parameter of performing the oxygen plasma surface treatment. Relevant parameters of the oxygen plasma surface treatment comprise a temperature of 300° C., power of 120 W, duration of 20 min, and x equal to 2.

In step 3), a resistive switching layer made of HZO (i.e., $Hf_nZr_{1-n}O_2$) is grown on the dielectric layer through atomic layer deposition, where a temperature of the disposition is 250° C., n is equal to 0.5, and a thickness of the resistive switching layer is 4 nm.

In step 4), a top electrode layer made of Ru is deposited on the resistive switching layer through sputtering, where a thickness of the top electrode layer is 40 nm.

In step 5), the structure obtained in the step 4) is subject to rapid annealing at a temperature of 500° C. for duration of 60 s. Thereby, the reservoir computing apparatus of the first embodiment is obtained.

First Comparative Example

Steps and conditions of the first comparative example refer to those in the first embodiment, except that the foregoing step 5) is not performed. Thereby, the reservoir computing apparatus of the first comparative example is obtained.

Hereinafter performances of the reservoir computing apparatuses manufactured in the first embodiment and the first comparative example are assessed.

Figure 2:
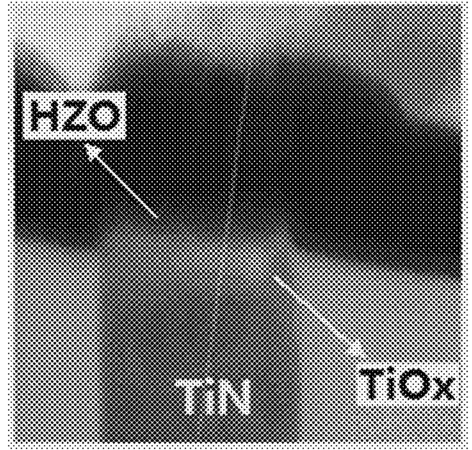
FIG. 2 is a TEM image of a reservoir computing apparatus according to a comparative example of the present disclosure.

First, the reservoir computing apparatuses manufactured in the first embodiment and the first comparative example are assessed via transmission electron microscopy (TEM), and the results are shown in FIGS. 1 and 2. FIG. 1 is a TEM image of the reservoir computing apparatus according to the first embodiment of the present disclosure. FIG. 2 is a TEM image of the reservoir computing apparatus according to the first comparative example. Comparison between FIG. 1 and FIG. 2 show that there is a more obvious interface layer in FIG. 1. The reason lies in that an amorphous state is transformed into a crystalline state through the annealing, and hence the resultant film is more stable and has a higher breakdown voltage.

Figure 3:
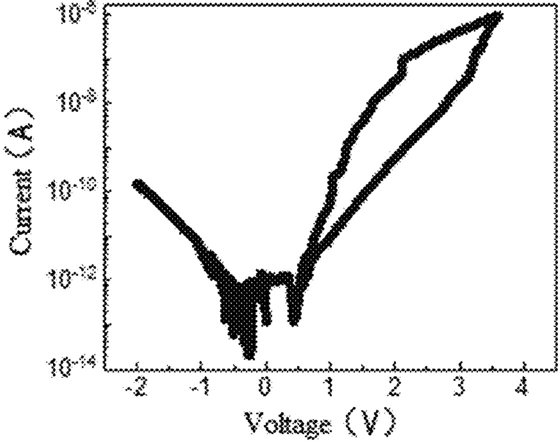
FIG. 3 is a graph of a direct-current I-V curve of a reservoir computing apparatus according to an embodiment of the present disclosure.
Figure 4:
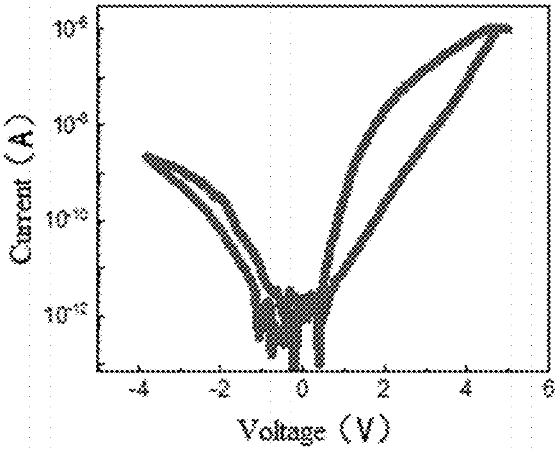
FIG. 4 is a graph of a direct-current I-V curve of a reservoir computing apparatus according to a comparative example of the present disclosure.

Second, the reservoir computing apparatuses manufactured in the first embodiment and the first comparative example are assessed via a scan of direct-current I-V curves, and the results are shown in FIGS. 3 and 4. FIG. 3 is a graph of a direct-current I-V curve of the reservoir computing apparatus according to the first embodiment of the present disclosure. FIG. 4 is a graph of a direct-current I-V curve of the reservoir computing apparatus according to the first comparative example. Comparison between FIG. 3 and FIG. 4 shown that for the same current, an operating voltage of the reservoir computing apparatus in the first embodiment is significantly lower. It indicates power consumption of the annealed apparatus is significantly lower.

Figure 5:
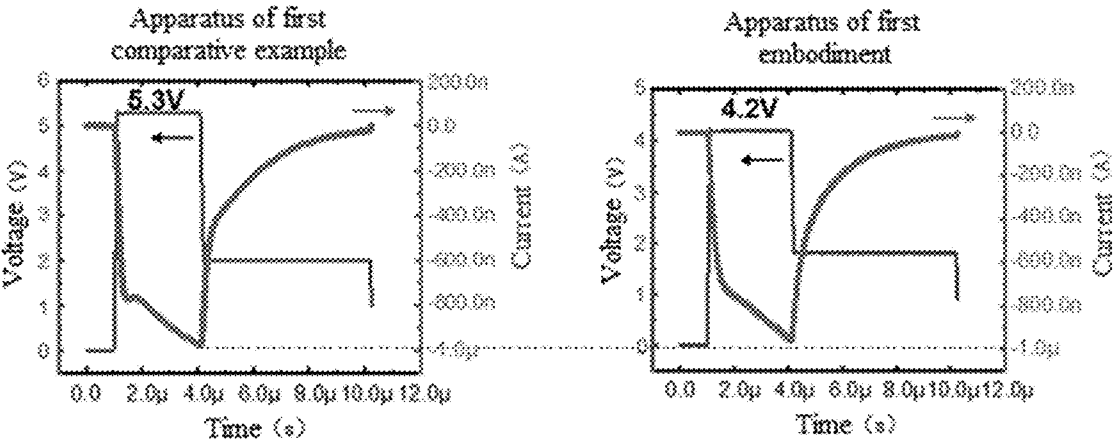
FIG. 5 is graphs of dynamic characteristic curves of reservoir computing apparatuses according to an embodiment of the present disclosure and a comparative example, respectively.

Third, the reservoir computing apparatuses manufactured in the first embodiment and the first comparative example are assessed through dynamic characteristic tests, and the results are shown in FIG. 5. FIG. 5 is a graph of dynamic characteristic curves of the reservoir computing apparatuses according to the first embodiment of the present disclosure and the first comparative example. The first comparative example is shown in the left sub-figure, while the first embodiment is shown in the right sub-figure. It is clear from FIG. 5 that the operating voltage for achieving the same current is significantly lower for the apparatus of the first embodiment than for the apparatus of the first comparative example. Power consumption is calculated through P=I·v·t, and hence the power consumption of the apparatus of the first embodiment (i.e., the annealed apparatus) is significantly lower than that of the apparatus of the first comparative example.

Fourth, the results of the dynamic characteristic tests on the reservoir computing apparatuses manufactured in the first embodiment and the first comparative example are fitted through an equation $$y = y_0 + A_1 \times e^{\frac{x-x_0}{\tau}}.$$

Figure 6:
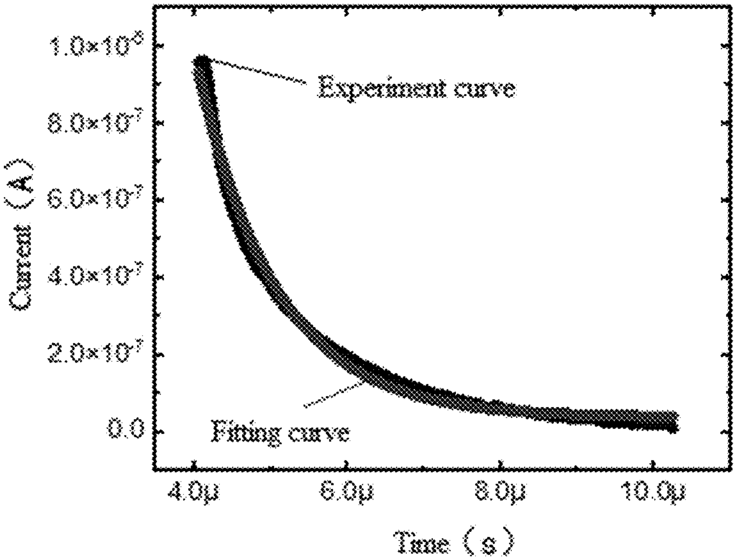
FIG. 6 is a graph of data fitting on a dynamic characteristic curve of a reservoir computing apparatus according to an embodiment of the present disclosure.
Figure 7:
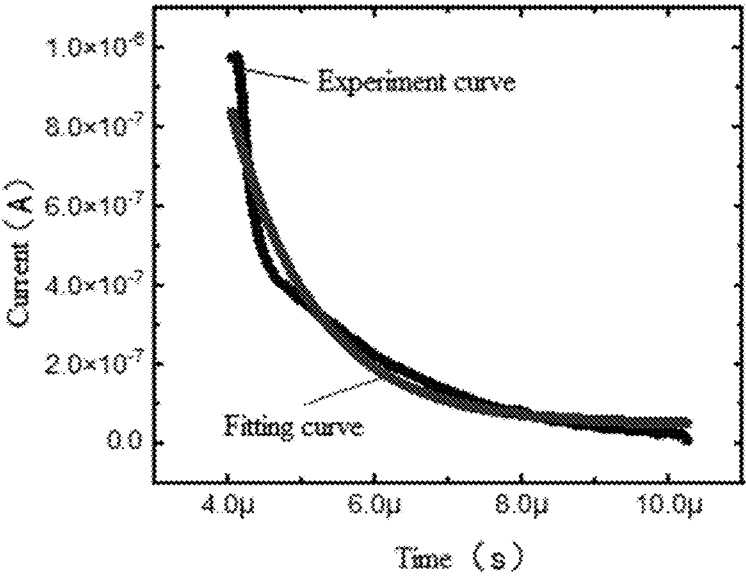
FIG. 7 is a graph of data fitting on a dynamic characteristic curve of a reservoir computing apparatus according to a comparative example of the present disclosure.

The fitting results are shown in FIGS. 6 and 7. FIG. 6 is a graph of data fitting on the dynamic characteristic curve of the reservoir computing apparatus according to the first embodiment of the present disclosure. FIG. 7 is a graph of data fitting on the dynamic characteristic curve of the reservoir computing apparatus according to the first comparative example. Comparison between FIG. 6 and FIG. 7 shown that the curve of the apparatus of the first embodiment can be fitted much better, and thereby simulation data has better approximation to actual data. Hence, accuracy of the RC system is easier to be improved.

Second Embodiment

Steps and conditions of the second embodiment refer to those in the first embodiment, except that the temperature of the annealing is 300° C. and the duration of the annealing is 100 s in the step 5). Thereby, the reservoir computing apparatus of the second embodiment is obtained.

Figure 8:
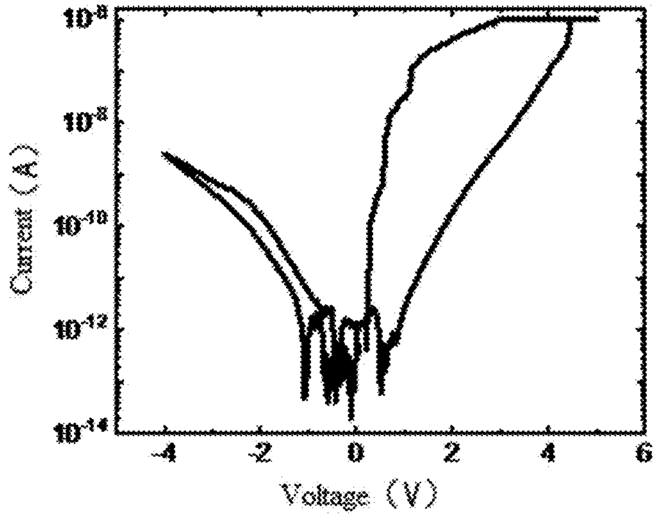
FIG. 8 is a graph of a direct-current I-V curve of a reservoir computing apparatus according to another embodiment of the present disclosure.
Figure 9:
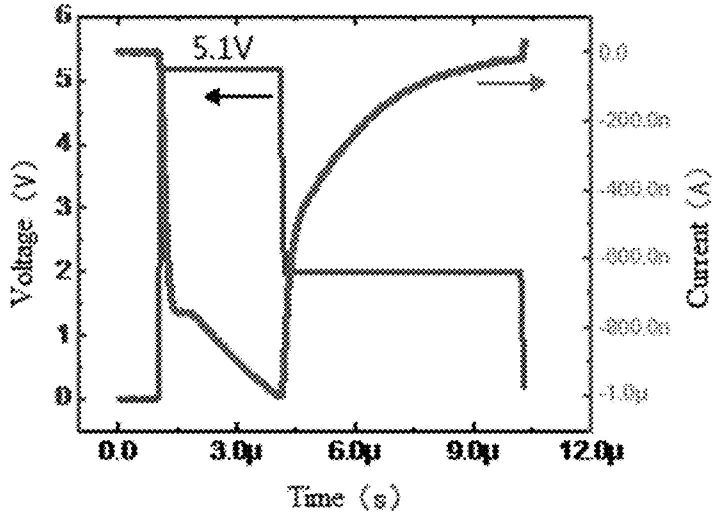
FIG. 9 is a graph of a dynamic characteristic curve of a reservoir computing apparatus according to another embodiment of the present disclosure.
Figure 10:
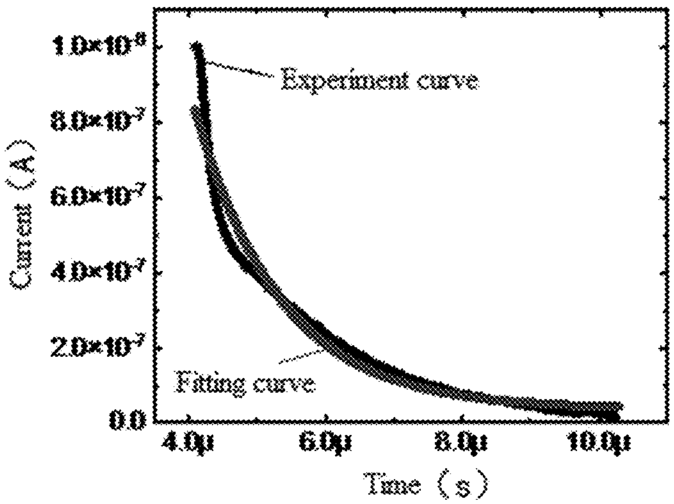
FIG. 10 is a graph of data fitting on a dynamic characteristic curve of a reservoir computing apparatus according to another embodiment of the present disclosure.

The reservoir computing apparatus of the second embodiment is subject to a scan of a direct-current I-V curve, a dynamic characteristic test, and data fitting on a dynamic characteristic curve, and the results are shown in FIGS. 8 to 10. FIG. 8 is a graph of the direct-current I-V curve of the reservoir computing apparatus according to the second embodiment of the present disclosure. FIG. 9 is a graph of the dynamic characteristic curve of the reservoir computing apparatus according to the second embodiment of the present disclosure. FIG. 10 is a graph of data fitting on the dynamic characteristic curve of the reservoir computing apparatus according to the second embodiment of the present disclosure.

Third Embodiment

Steps and conditions of the third embodiment refer to those in the first embodiment, except that the temperature of the annealing is 700° C. and the duration of the annealing is 30 s in the step 5). Thereby, the reservoir computing apparatus of the third embodiment is obtained.

Figure 11:
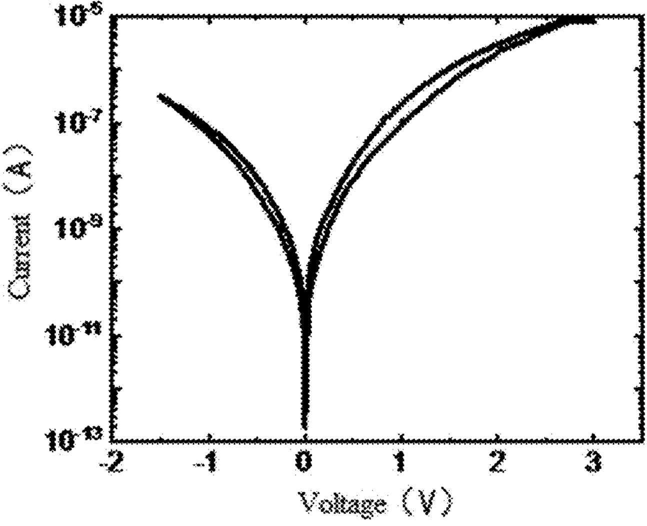
FIG. 11 is a graph of a direct-current I-V curve of a reservoir computing apparatus according to another embodiment of the present disclosure.
Figure 12:
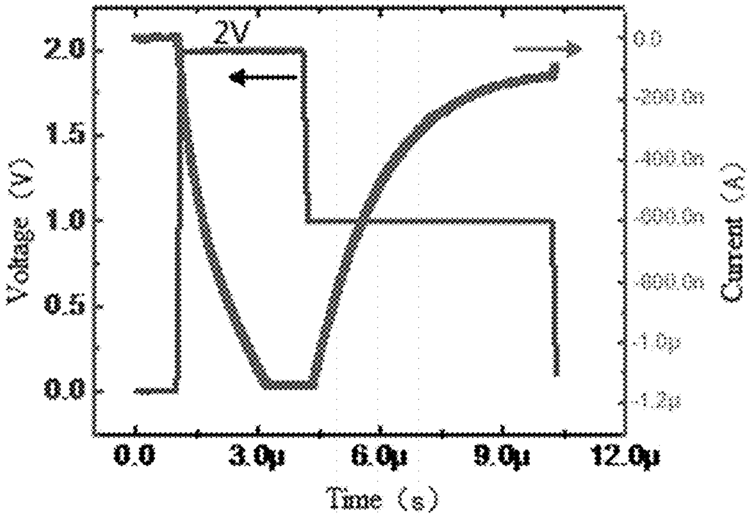
FIG. 12 is a graph of a dynamic characteristic curve of a reservoir computing apparatus according to another of the present disclosure.
Figure 13:
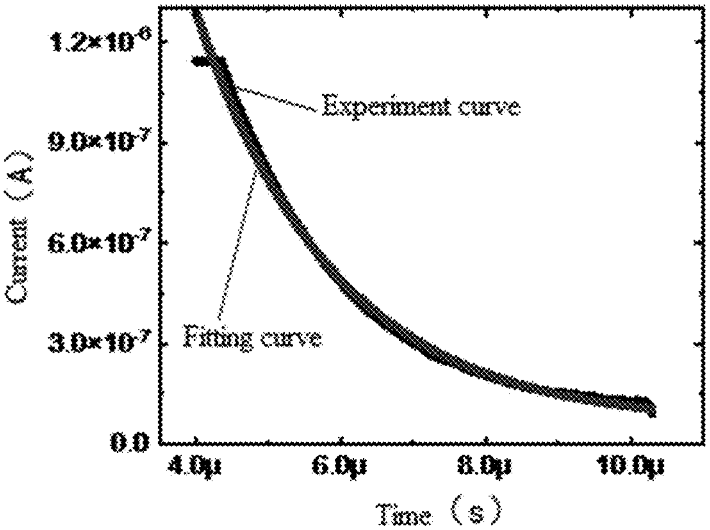
FIG. 13 is a graph of data fitting on a dynamic characteristic curve of a reservoir computing apparatus according to another of the present disclosure.

The reservoir computing apparatus of the third embodiment is subject to a scan of a direct-current I-V curve, a dynamic characteristic test, and data fitting on a dynamic characteristic curve, and the results are shown in FIGS. 11 to 13. FIG. 11 is a graph of the direct-current I-V curve of the reservoir computing apparatus according to the third embodiment of the present disclosure. FIG. 12 is a graph of the dynamic characteristic curve of the reservoir computing apparatus according to the third embodiment of the present disclosure. FIG. 13 is a graph of data fitting on the dynamic characteristic curve of the reservoir computing apparatus according to the third embodiment of the present disclosure.

Hereinabove described are only preferable embodiments of the present disclosure. It should be noted that those skilled in the art may make some variations and improvements to theses embodiments without departing from the principle of the present disclosure, and such variations and improvements also fall within the protection scope of the present disclosure.

The invention claimed is:

1. A method for manufacturing a reservoir computing apparatus, comprising:

providing a bottom electrode layer, a dielectric layer, a resistive switching layer, and a top electrode layer based on the above-listed sequence on a substrate to obtain a to-be-annealed reservoir computing apparatus, wherein the bottom electrode layer is made of TiN, the dielectric layer is made of $TiO_x$, x=2, the resistive switching layer is made of $Hf_nZr_{1-n}O_2$, and $0<n<1$, and the top electrode layer is made of Ru; and annealing the to-be-annealed reservoir computing apparatus to obtain the reservoir computing apparatus, wherein a temperature of the annealing ranges from 300° C. to 700° C., and duration of the annealing duration ranges from 30 s to 100 s.

2. The method according to claim 1, wherein providing the bottom electrode layer comprises providing the bottom electrode layer through one or more of: sputtering, physical vapor deposition, and chemical vapor deposition.

3. The method according to claim 1, wherein:

a thickness of the bottom electrode layer ranges from 15 nm to 300 nm.

4. The method according to claim 1, wherein providing the dielectric layer comprises providing the dielectric layer through one or both of sputtering and oxygen plasma surface treatment.

5. The method according to claim 1, wherein providing the resistive switching layer comprises providing the resistive switching layer through one or more of: atomic layer deposition, magnetron sputtering, and ion beam sputtering.

6. The method according to claim 1, wherein:

a thickness of the resistive switching layer ranges from 2.5 nm to 6 nm.

7. The method according to claim 1, wherein providing the top electrode layer comprises providing the top electrode layer through sputtering.

8. The method according to claim 1, wherein:

a thickness of the top electrode layer ranges from 20 nm to 60 nm.

9. The method according to claim 1, wherein the temperature of the annealing is 500° C., and the duration of the annealing is 60 s.

* * * * *